United States Patent [19]
Sullivan et al.

[11] Patent Number: 5,652,526
[45] Date of Patent: Jul. 29, 1997

[54] ELECTRIC MOTOR ANALYZER

[75] Inventors: Kevin C. Sullivan, Anaheim; Manuel R. Cabison, San Gabriel; Isidor Kerszenbaum, Irvine; Juan P. Lopetrone; Tom Baker, both of Fountain Valley, all of Calif.

[73] Assignee: Southern California Edison Company, Rosemead, Calif.

[21] Appl. No.: 617,470

[22] Filed: Mar. 15, 1996

[51] Int. Cl.$^6$ .................................................. G01R 27/18
[52] U.S. Cl. ........................................... 324/772; 318/490
[58] Field of Search ........................ 324/772; 318/490; 328/510

[56] References Cited

U.S. PATENT DOCUMENTS

| | | | |
|---|---|---|---|
| 2,626,307 | 1/1953 | Suhr et al. | 175/183 |
| 2,970,260 | 1/1961 | Flint | 324/73 |
| 3,151,479 | 10/1964 | Willyoung | 73/118 |
| 3,978,404 | 8/1976 | Friend | 324/115 |
| 4,075,559 | 2/1978 | Chaprnka et al. | 324/115 |
| 4,086,531 | 4/1978 | Bernier | 324/158 |
| 4,140,965 | 2/1979 | Neal | 324/54 |
| 4,194,129 | 3/1980 | Dumbeck | 307/149 |
| 4,340,847 | 7/1982 | Izumi | 318/490 |
| 4,441,076 | 4/1984 | Baum | 324/158 |
| 4,540,922 | 9/1985 | Horvath et al. | 318/490 |
| 4,670,698 | 6/1987 | Fulton et al. | 318/802 |
| 4,682,103 | 7/1987 | DeNardis | 324/158 |
| 4,727,320 | 2/1988 | Brennan | 324/158 |
| 4,739,256 | 4/1988 | Fletcher et al. | 324/158 |
| 4,876,502 | 10/1989 | Verbanets et al. | 324/115 |
| 4,933,631 | 6/1990 | Eccleston | 324/115 |
| 4,943,764 | 7/1990 | Szente et al. | 324/95 |
| 5,250,893 | 10/1993 | Gambill et al. | 324/115 |
| 5,258,704 | 11/1993 | Germer et al. | 324/142 |
| 5,266,902 | 11/1993 | Kovacich et al. | 324/537 |
| 5,278,493 | 1/1994 | Henkelmann | 324/115 |
| 5,281,908 | 1/1994 | Kondo | 324/158 |
| 5,319,305 | 6/1994 | Baba | 324/115 |
| 5,418,448 | 5/1995 | Aslan | 324/95 |

*Primary Examiner*—Vinh P. Nguyen
*Assistant Examiner*—Barry C. Bowser
*Attorney, Agent, or Firm*—Denton L. Anderson; Sheldon & Mak, Inc.

[57] ABSTRACT

An analyzer for performing high and low voltage tests on an electric induction machine having electric power input terminals. The analyzer comprises: (a) a high voltage testing circuit for performing high voltage tests on the induction machine; (b) a low voltage testing circuit for performing low voltage tests on the induction machine; (c) electrical terminals for electrical connection with the power input terminals of the induction machine; (d) a plurality of switches electrically connecting the high voltage testing circuit and the low voltage testing circuit to the terminals, each switch having one or more control input terminals for receiving control signals for closing and opening the switch; and (e) a controller having a first set of output terminals electrically connected to the control input terminals of the switches, the controller providing control signals to the switches to selectively open one or more of the switches and to selectively close one or more of the switches to: (i) provide electrical conduction paths between the high voltage testing circuit and the induction machine through the closed switches, while electrically isolating the low voltage testing circuit from the high voltage testing circuit through the open switches; and (ii) provide electrical conduction paths between the low voltage testing circuit and the conduction machine through the closed switches, while electrically isolating the high voltage testing circuit from the low voltage testing circuit through the open switches.

19 Claims, 11 Drawing Sheets

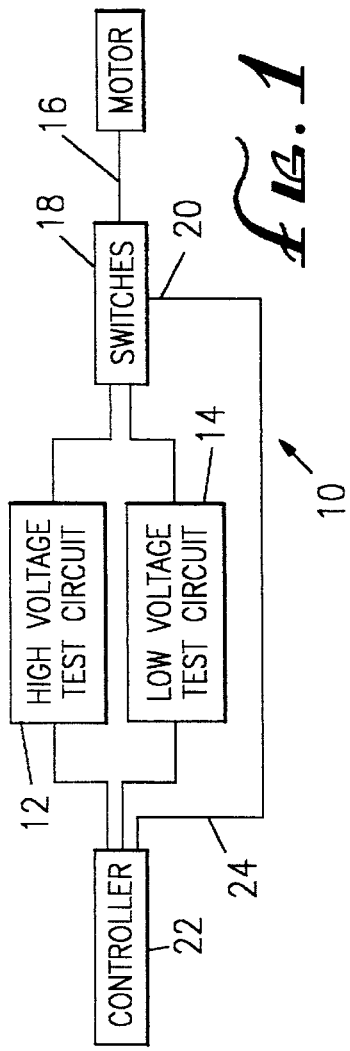
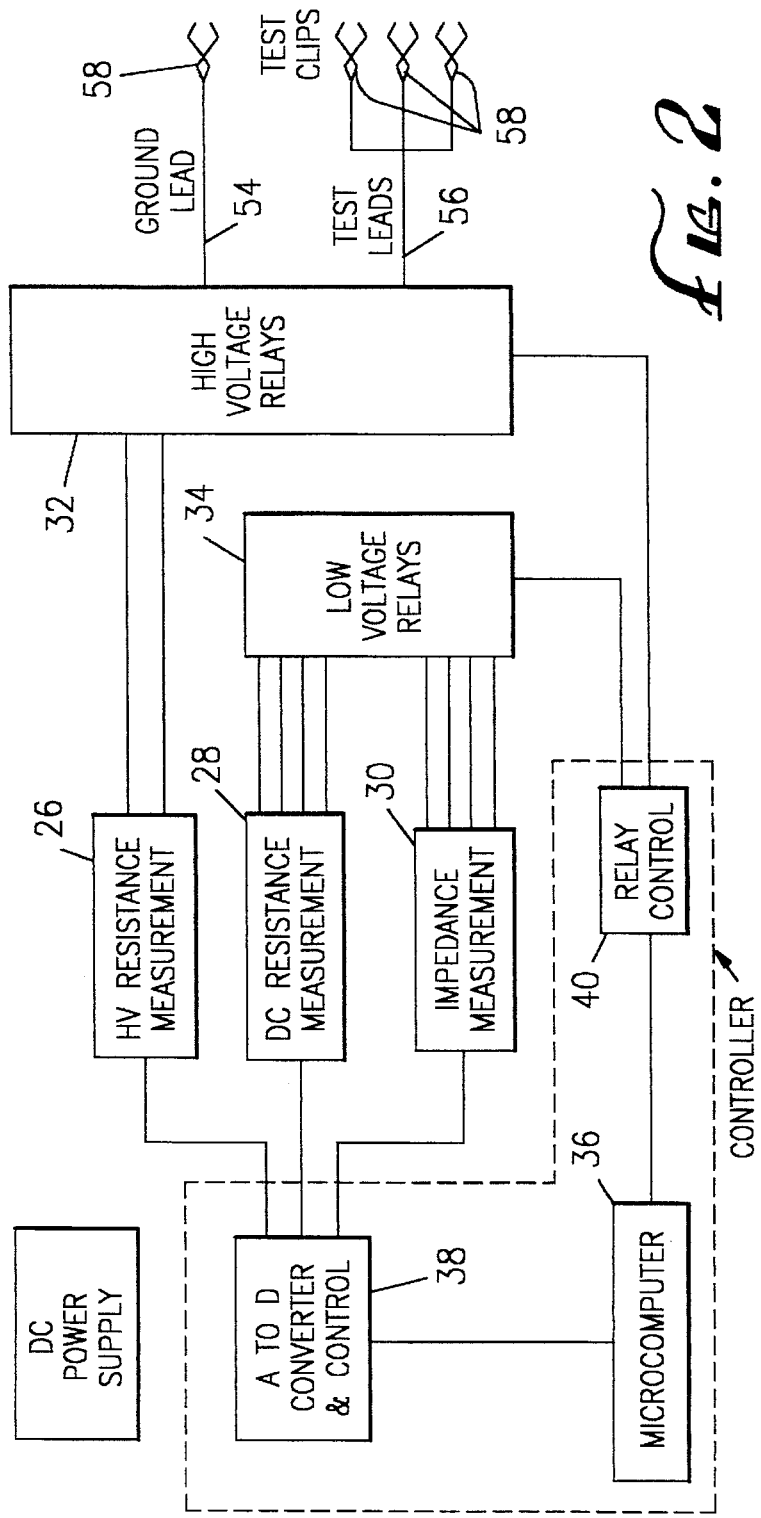

SYSTEM CONTROLLER BOARD BLOCK DIAGRAM

HIGH VOLTAGE INSULATION RESISTANCE
MEASUREMENT CARD BLOCK DIAGRAM

RESISTANCE MEASUREMENT CARD
BLOCK DIAGRAM

IMPEDANCE MEASUREMENT CARD
BLOCK DIAGRAM

ANALOG TO DIGITAL CONVERSION CARD BLOCK DIAGRAM

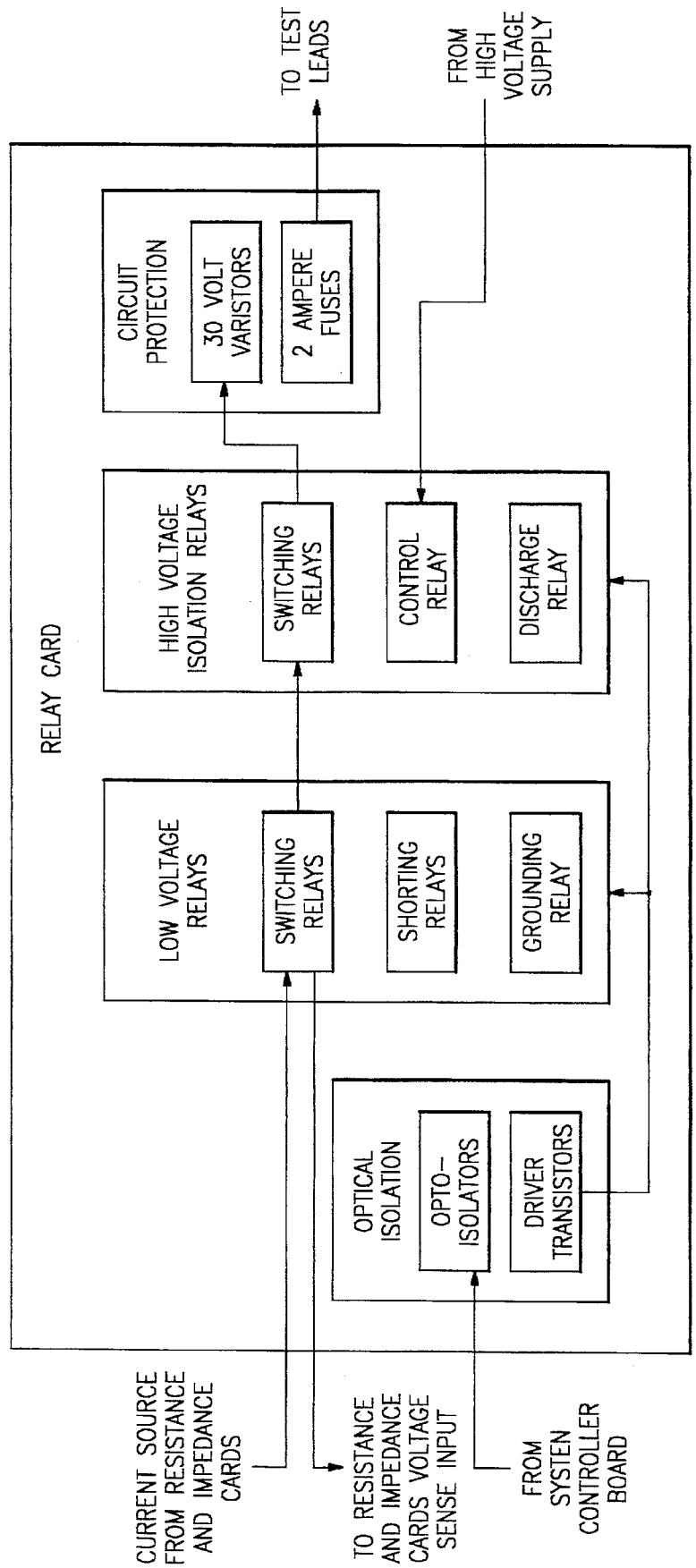

5,652,526

ELECTRIC MOTOR ANALYZER

NOTICE OF INCLUSION OF COPYRIGHTED MATERIAL

A portion of the disclosure of this patent document contains material which is subject to copyright protection. The copyright owner has no objection to the facsimile reproduction by any one of the patent disclosure, as it appears in the Patent and Trademark Office patent files or records, but otherwise reserves all copyright rights whatsoever.

BACKGROUND

The present invention relates to devices for analyzing electrical induction machines, and more particularly, to devices for analyzing electric induction motors by performing high-voltage and low-voltage tests on the motors.

With increasing deregulation of electric utilities, many electric utility companies find themselves in competition with other electric utilities. In order to successfully compete, many electric utilities have focused their efforts on reducing operation and maintenance costs associated with generation of electrical power. A significant aspect of such cost reduction is concentrated on predictive maintenance, or condition-based maintenance programs, designed to provide "just-in-time" maintenance to operational equipment.

In electrical utility stations, an important class of operational equipment which can significantly benefit from predictive maintenance includes the many induction machines, such as electric motors, in operation. Electric motors are expensive machines and are crucial to providing uninterrupted power to consumers. An important battery of tests for implementing predictive maintenance on electric motors includes high-voltage testing and low-voltage testing of the electric motors. These tests include measuring insulation resistance, conductor resistance, and impedance. Both high-voltage tests and low-voltage tests are necessary to determine the status of electric motors and to perform preventative maintenance.

In performing such tests, electric utilities currently utilize a number of devices, including at least one device for high-voltage testing and at least one device for low-voltage testing of electric motors. As such, an operator must physically carry several test devices to each electric motor in order to perform a complete set of tests on the motors. The operator must then electrically connect each device to an electric motor, perform a desired test, disconnect the device from the electric motor, and repeat the entire procedure for the next motor. This is highly disadvantageous because the operator must carry around several devices, and individually connect and disconnect the test devices from an electric motor being tested.

Further, existing testing devices do not provide built-in "intelligence" to automatically process the test results and make determinations as to the status of a tested motor. Currently, an operator who performs the tests has to also review the results of the tests to determine whether a motor requires maintenance, repairs or otherwise. However, most individuals assigned to testing do not have the required training to make informed decisions about the status of the electric motor based on the test results. Therefore, the test results must be communicated to a specialist who can determine the status of the electric motors and suggest a course of action. This is unsatisfactory, however, because of the excessive person power involved in performing tests and in analyzing the tests results, and because of the delay inherent in having the test results reviewed by a specialist.

There is, therefore, a need for an induction machine analyzer to allow performing both high voltage and low voltage testing of an induction machine using the same analyzer. There is also a need for the analyzer to have built-in intelligence to process the test results and provide information about the status of the induction machine tested.

SUMMARY

The present invention satisfies these needs. The present invention provides an analyzer for performing high and low voltage tests on an electric induction machine having electric power input terminals. The analyzer comprises: (a) a high voltage testing circuit for performing high voltage tests on the induction machine; (b) a low voltage testing circuit for performing low voltage tests on the induction machine; (c) electrical terminals for electrical connection with the power input terminals of the induction machine; (d) a plurality of switches electrically connecting the high voltage testing circuit and the low voltage testing circuit to the terminals, each switch having one or more control input terminals for receiving control signals for closing and opening the switch; and (e) a controller having a first set of output terminals electrically connected to the control input terminals of the switches, the controller providing control signals to the switches to selectively open one or more of the switches and to selectively close one or more of the switches.

The controller provides electrical conduction paths between the high voltage testing circuit and the induction machine through the closed switches, while isolating the low voltage testing circuit from the high voltage testing circuit through the open switches. The controller further provides electrical conduction paths between the low voltage testing circuit and the conduction machine through the closed switches, while electrically isolating the high voltage testing circuit from the low voltage testing circuit through the open switches.

Preferably, the switches comprise one or more high voltage relay switches for providing electrical conduction paths between the high voltage testing circuit and the conduction machine. The switches further comprise one or more low voltage relay switches for providing electrical conduction paths between the low voltage testing circuit and the conduction machine.

Preferably, the high voltage testing circuit generates a test voltage of at least about 500 volts DC, and the low voltage testing circuit generates a test voltage of at most about 2.5 volts.

The high voltage testing circuit comprises an insulation resistance measurement circuit, and the low voltage testing circuit comprises a resistance measurement circuit and an impedance measurement circuit. The low voltage testing circuit includes a switch responsive to control input signals for initiating low voltage tests, and the high voltage testing circuit includes a switch responsive to control input signals for initiating high voltage tests. The controller generates an input control signal for the low voltage testing circuit to perform low voltage testing after the controller has provided electrical conduction paths between the low voltage testing circuit and the conduction machine. The controller further generates an input control signal for the high voltage testing circuit to perform high voltage testing after the controller has provided electrical conduction paths between the high voltage testing circuit and the induction machine.

The high voltage testing circuit generates test-result output signals representative of results of high voltage testing of the induction machine, and the low voltage testing circuit generates test-result output signals representative of results of low voltage testing of the induction machine. The controller includes a processor responsive to the high voltage testing circuit and responsive to the low voltage testing circuit for receiving high and low voltage test-result output signals from the testing circuits, and for processing the signals to generate a report indicative of the status of the induction machine.

DRAWINGS

These and other features, aspects and advantages of the present invention will become understood with reference to the following description, appended claims and accompanying drawings where:

FIG. 1 is a block diagram of an embodiment of an analyzer according to the present invention;

FIG. 2 is a detailed block diagram of the analyzer of FIG. 1;

FIG. 14 illustrates a detailed block diagram of an example embodiment of the relay control circuit of the analyzer for interface with the controller of FIG. 8.

DESCRIPTION

Figure 3:
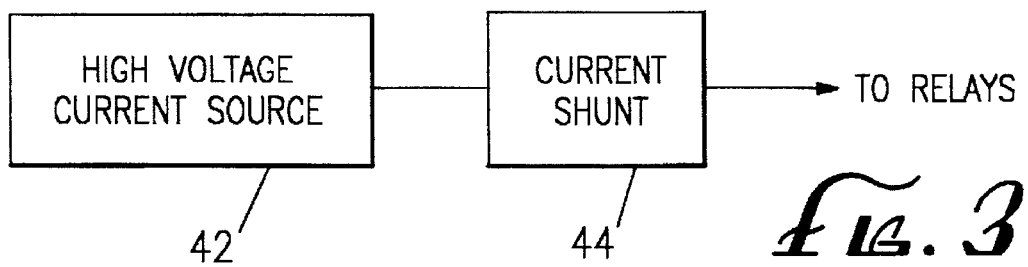
FIG. 3 is a block diagram of the high voltage resistance measurement circuit of the analyzer of FIG. 1.

FIG. 1 illustrates a block diagram of an embodiment of the analyzer 10 of the present invention is shown for performing high and low voltage tests on an electric induction machine having electric power input terminals. The analyzer 10 comprises: (a) a high voltage testing circuit 12 for performing high voltage tests on the induction machine; (b) a low voltage testing circuit 14 for performing low voltage tests on the induction machine; (c) electrical terminals 16 for electrical connection with the power input terminals of the induction machine; (d) a plurality of switches 18 electrically connecting the high voltage testing circuit 12 and the low voltage testing circuit 14 to the terminals, each switch having one or more control input terminals 20 for receiving control signals for closing and opening the switch; and (e) a controller 22 having a first set of output terminals 24 electrically connected to the control input terminals 20 of the switches 18, the controller 22 providing control signals to the switches 18 to selectively open one or more of the switches 18 and to selectively close one or more of the switches 18.

The controller 22 provides electrical conduction paths between the high voltage testing circuit 12 and the induction machine through the closed switches 18, while isolating the low voltage testing circuit 14 from the high voltage testing circuit 12 through the open switches 18. The controller 22 further provides electrical conduction paths between the low voltage testing circuit 14 and the conduction machine through the closed switches 18, while electrically isolating the high voltage testing circuit 12 from the low voltage testing circuit 14 through the open switches 18.

FIG. 2 illustrates a detailed block diagram of the analyzer 10 of FIG. 1. The high voltage testing circuit 12 comprises an insulation resistance measurement circuit 26, and the low voltage testing circuit 14 comprises a resistance measurement circuit 28 and an impedance measurement circuit 30. The switches 18 comprise one or more high voltage relay switches 32 for providing electrical conduction paths between the high voltage testing circuit 12 and the conduction machine. The switches 18 further comprise one or more low voltage relay switches 34 for providing electrical conduction paths between the low voltage testing circuit 14 and the conduction machine. The controller 22 comprises a processor 36 for providing control signals to the relay switches 18 and for selecting the testing circuits, and an analog-to-digital converter circuit 38 for converting analog test result signals from the test circuits to digital signals for use by the processor 36. The controller 22 further comprises a relay control circuit 40 for controlling both the high voltage and low voltage relays 32 and 34, respectively, based on control signals received from the processor 36.

FIG. 3 illustrates a block diagram of the insulation resistance measurement circuit 26 of the high voltage testing circuit 12 for performing coil resistance tests. The insulation resistance circuit 26 supplies a high voltage direct current to the induction machine and measures a resulting leakage current of the induction machine. The insulation resistance circuit 26 includes a high voltage direct current source 42 for generating a high voltage direct current, and a current shunt resistor 44 electrically connected as shown. The leakage current passes through the current shunt resistor 44 and develops a voltage across the resistor 44 indicative of the insulation resistance of the induction machine. Preferably, the current source 42 generates a direct current at a voltage of about 500 to about 1000 volts. The resistance value of the current shunt resistor 44 is preferably about 900 ohms.

Figure 4:
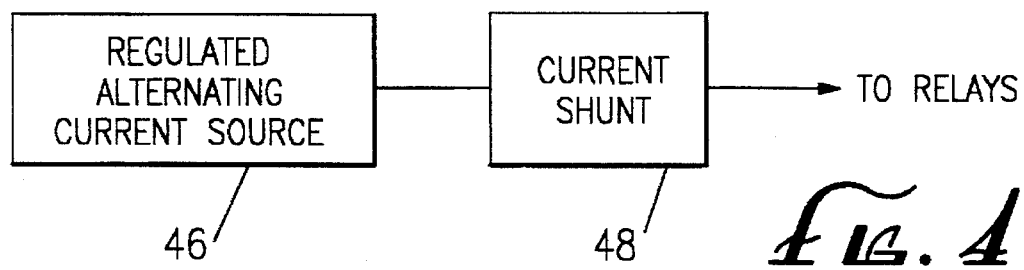
FIG. 4 is a block diagram of the low voltage impedance measurement circuit of the analyzer of FIG. 1.

FIG. 4 illustrates a block diagram of the impedance measurement circuit 30 of the low voltage testing circuit 14 for performing coil impedance tests. The impedance measurement circuit 30 supplies an alternating current to the induction machine and measures a resulting voltage to determine the impedance of the induction machine. The impedance measurement circuit 30 includes a regulated alternating current source 46 for generating a regulated alternating current, and a current shunt resistor 48 electrically connected as shown. The alternating current passes through the shunt resistor 48 and the output voltage of the resistor 48 is indicative of the impedance of the induction machine. Preferably, the regulated alternating current source 46 generates a regulated alternating current of about 0.1 amp and at a maximum voltage of about 2.5 volts. Preferably, the frequency of the alternating current is about 100 Hz. The resistance values of the shunt resistor 48 is preferably about 10 ohms.

The impedance measurement circuit 30 can also be utilized to determine the polarization index of the inductance machine. To determine the polarization index, the insulation resistance is measured over a test period of about 10 minutes and the measurements are saved about every 10 second. The polarization index is calculated by dividing the measurements obtained at 10 minutes by the measurements obtained at 1 minute. The 10 second measurements can be utilized to generate a graph or a table illustrating the increase in resistance over the test period. The measurements are routed to the processor 36 and the processor 36 performs the polarization index computations described above.

Figure 5:
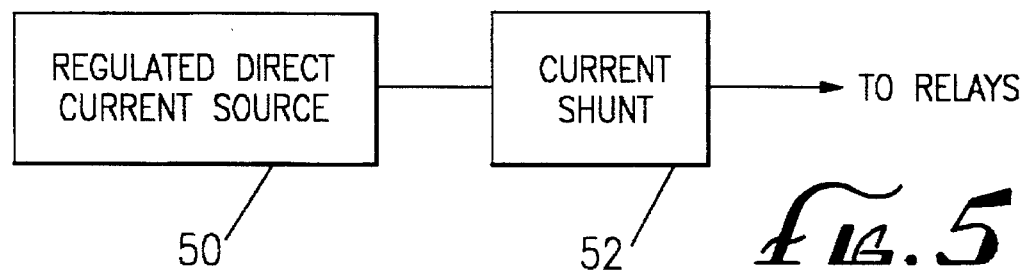
FIG. 5 is a block diagram of the low voltage resistance measurement circuit of the analyzer of FIG. 1.

FIG. 5 illustrates a block diagram of the resistance measurement circuit 28 of the low voltage testing circuit 14 for performing insulation resistance tests. The resistance measurement circuit 28 supplies a direct current to the induction machine and measures a resulting voltage to determine the resistance of the induction machine. The resistance measurement circuit 28 includes a regulated direct current source 50 for generating a direct current, and a current shunt resistor 52 electrically connected as shown. The current passes through the resistor 52 and the output voltage of the resistor 52 is indicative of the resistance of the induction machine. Preferably, the regulated direct current source 50 generates a regulated current of about 0.5 amperes at a maximum voltage of about 2.5 volts. The resistance of the current shunt resistor 52 is preferably about 1 ohm.

Figure 6:
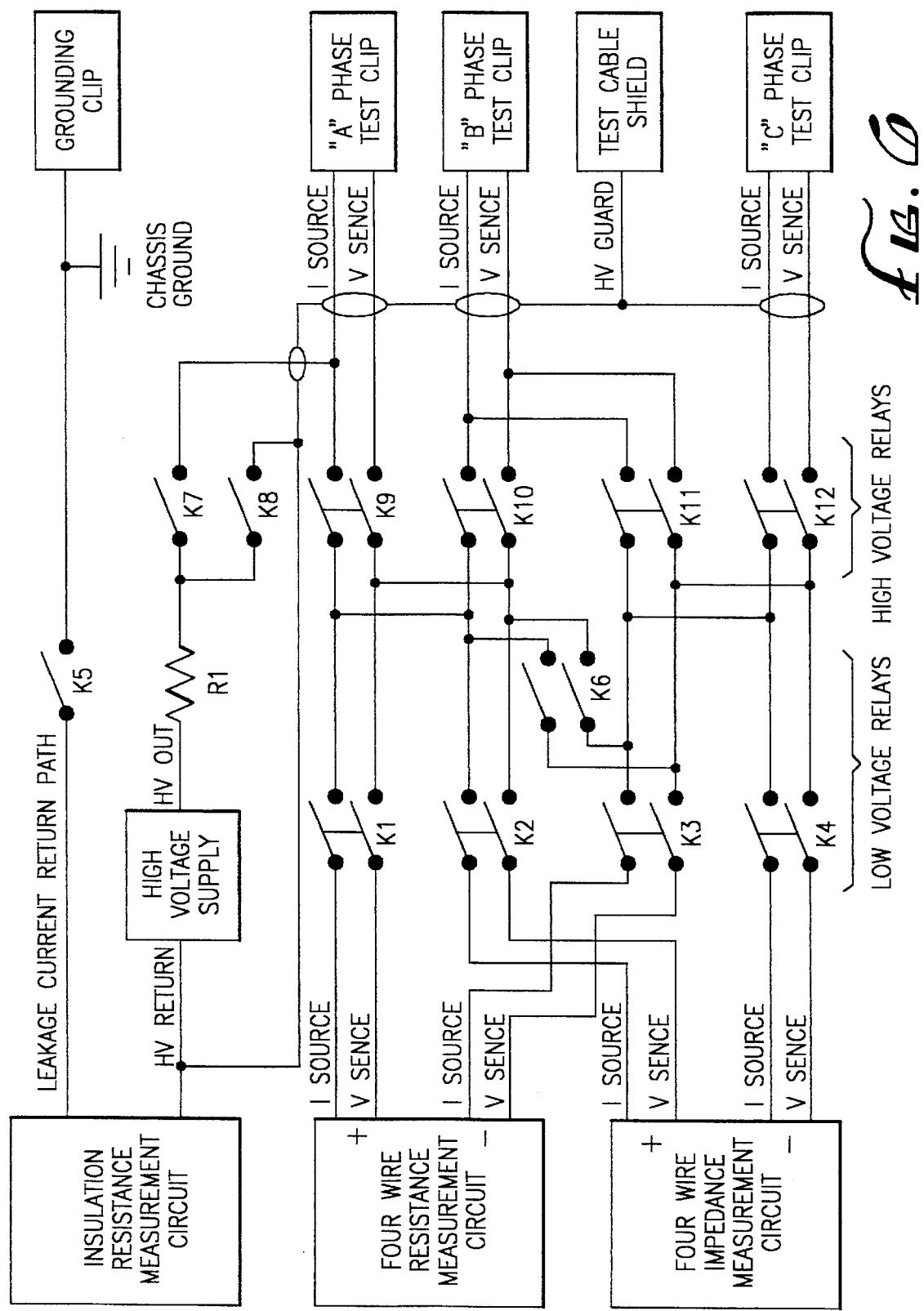
FIG. 6 is a diagram of relay switching scheme for the analyzer of FIG. 1.

The test currents generated by the high and low voltage testing circuits 12 and 14, respectively, are supplied to the induction machine through the high and low voltage relays 32 and 34, respectively, interconnected as shown in FIG. 6. The low voltage relays 34 include relays K1–K6 and the high voltage relays 32 include relays K7–K12. The low voltage relays K1–K4 provide electrical conduction paths between the resistance measurement circuit 28, the impedance measurement circuit 30 and the high voltage relays 32.

By selective closing of the low voltage relays 34, either the resistance measurement circuit 28, the impedance measurement circuit 30 or neither can be electrically connected to the high voltage relays 32. The high voltage relays 32 isolate the low voltage relays 34 and the low voltage testing circuit 14 when high voltage testing is performed. The high voltage relays 32 also switch between the output terminals of the analyzer 10 to measure the A, B or C phase of an induction machine such as a motor. The output terminals of the analyzer 10 include a ground lead 54 and test leads 56. The test leads 56 are electrically connected to a set of test clips 58 described below.

The relays K1, K2, K3 and K4 are low voltage reed relays. The relay K6 is a low voltage relay used for verifying the electrical connection of the test clips 58. The relay K5 is a low voltage relay which is closed during insulation resistance tests to provide a return path for motor insulation leakage resistance. The relay K7 is a high breakdown voltage relay used to connect a high voltage supply to the test leads 56 during insulation resistance measurements. The relay K8 is a high breakdown voltage relay that is closed at the end of high voltage testing to bleed off any residual high voltage from the motor being tested. The relays K9, K10, K11 and K12 are high breakdown voltage relays used to isolate the low voltage impedance and resistance measurement circuits 30 and 28, respectively, during high voltage insulation resistance testing. During coil resistance and impedance testing, the relays K9, K10, K11 and K12 are selectively closed to select the motor coil that is to be measured.

Table 1 shows the status of each relay for all possible test modes (closed relays are indicated with an "X"). By selectively closing the appropriate relays, advantageously, all testing may be performed without requiring the user to change any test lead connections. During high voltage testing, the low voltage resistance and impedance test circuits are protected from damage.

To select testing modes, the processor 36 of the controller 22 generates a control signal for the low voltage testing circuit 14 to perform low voltage testing after the controller 22 has provided electrical conduction paths between the low voltage testing circuit 14 and the conduction machine by selectively closing the relays according to Table 1. The processor 36 further generates a control signal for the high voltage testing circuit 12 to perform high voltage testing after the controller 22 has provided electrical conduction paths between the high voltage testing circuit 12 and the induction machine by selectively closing the relays according to Table 1.

As described above, the high voltage testing circuit 12 generates analog test-result output signals indicative of results of high voltage testing of the induction machine, and the low voltage testing circuit 14 generates analog test-result output signals indicative of results of low voltage testing of the induction machine. The test-result output signals are converted to digital signals by the analog-to-digital converter circuit 38 of the controller 22. The digital signals are processed by the processor 36 of the controller 22 to generate a report indicative of the status of the induction machine.

Figure 7:
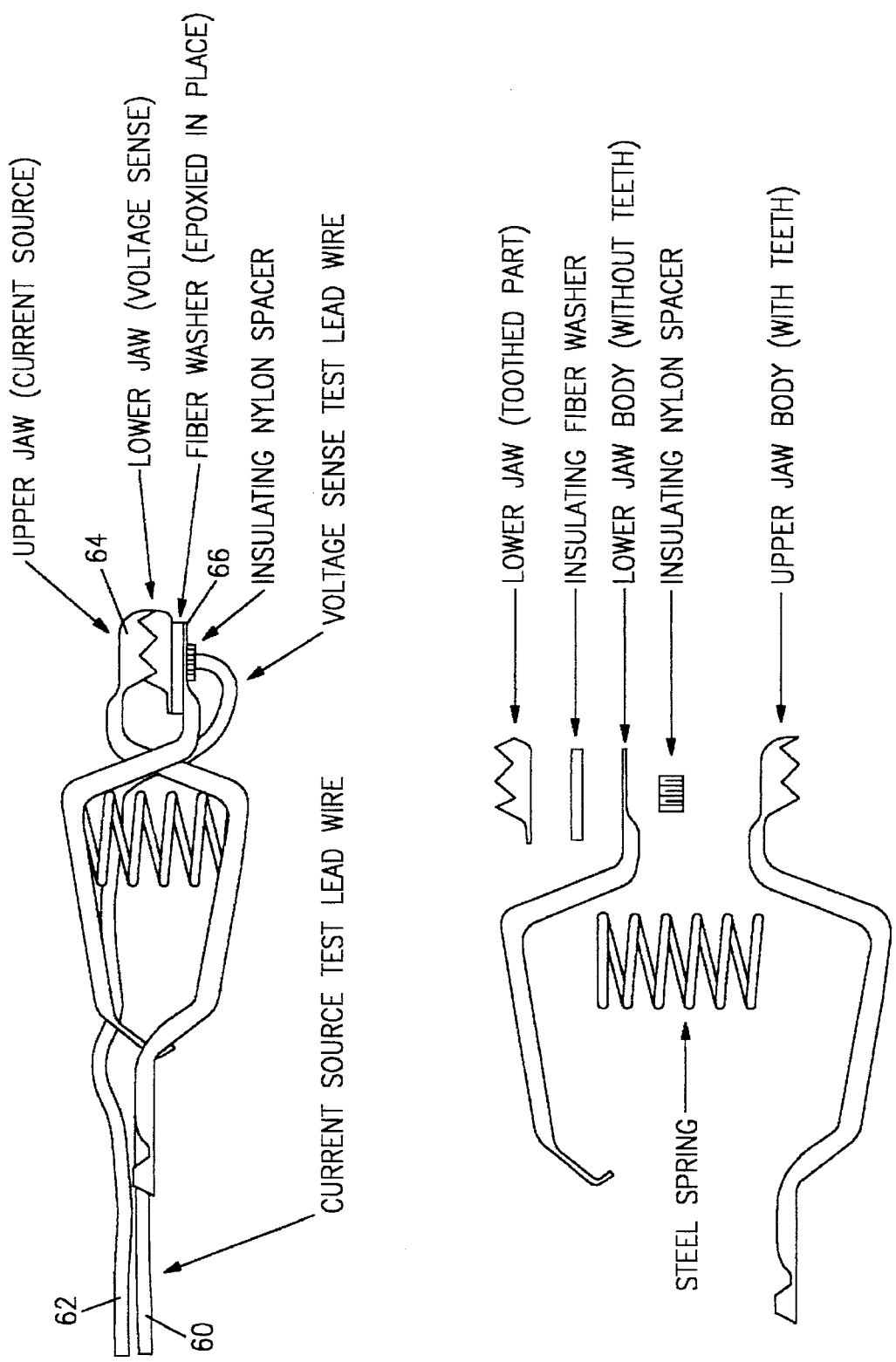
FIG. 7 is a diagram of the test leads and test clips of the analyzer of FIG. 1.

FIG. 7 is a drawing of the test leads 56 and contact test clips 58 of the analyzer 10. Each test lead 56 is a shielded high working voltage cable with six conductors, two per phase. For low voltage testing four conductors are used at a time, two for current and two for voltage measurement. During high voltage testing all of the conductors are energized at the test voltage and the shield is energized with a guard voltage to eliminate the measurement of any leakage resistance of the cable itself. The length of the test leads 56 may be extended by connecting additional cables in series.

FIG. 7 shows a drawing of one of the dual conductor test clips 58 with the test leads attached. Three test clips 58 are used for testing a three phase motor, one for each phase. Each test clip 58 has two leads 60 and 62, one for applying current and one for measuring voltage, respectively. Each test clip 58 has a jaw 64, each half of the jaw 64 is connected to one of the leads 60 and 62, and is insulated from the other half. As shown, the current source lead 60 is attached to the body of the clip 58 and one side of the toothed jaw 64. The other side of the toothed jaw 64 is insulated from the main body of the clip 58 by a fiber washer 66 and is electrically connected to the voltage sense test lead wire 62.

When measuring coil resistance two clips are used, one connected to the positive current source and one to the negative current source. The voltage developed across the coil is applied to the jaw which is connected to the voltage sense test lead. The coil resistance may then be calculated based on the value of the current applied and the voltage which is sensed.

By keeping the voltage sense connection separate from the current source connection, the resistance of the test leads 56 and the contact resistance of the clips is eliminated from the measurement. Measuring impedance is similar, except that an alternating current source is used and the voltage sensed is also alternating current.

Figure 8:
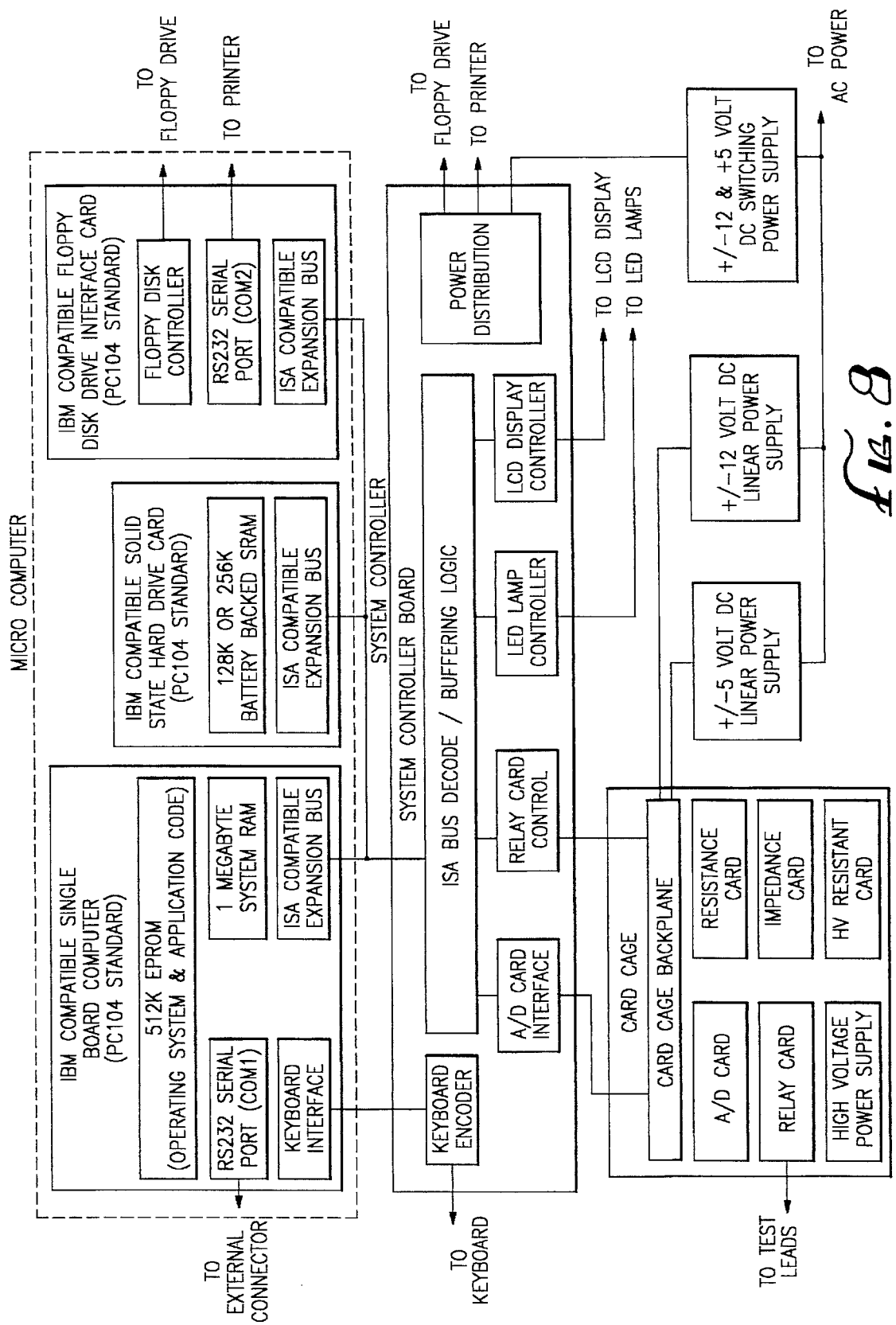
FIG. 8 illustrates a block diagram of an example embodiment of the analyzer of the present invention.

Referring to FIG. 8 an example of a preferred embodiment of the analyzer of the present invention is shown. In this embodiment, the analyzer includes a microcomputer, a system controller, a card cage, and three power supply units as shown. The card cage includes a card cage backplane for electrically interconnecting the analog-to-digital converter circuit, the low voltage resistance measurement circuit 28, the low voltage impedance measurement circuit 30, the high voltage insulation resistance measurement circuit 26, the relays, and a high voltage power supply.

The microcomputer accepts input from the user, coordinates all switching and measurement functions, sequences individual tests, saves and interprets measurement results, and presents the results to the user. The microcomputer includes a PC104 computer module, a solid state hard drive card, and a floppy disk driver interface card. The hard drive card includes 128K or 256K battery backed SRAM, and an ISA compatible expansion bus. The floppy disk drive interface card includes a floppy disk controller, an RS232 serial port for communication, and an ISA compatible expansion bus. The PC104 computer module includes 512K EPROM for operating system and application code, 1 Megabyte system RAM, an RS232 serial port for serial communication, a keyboard interface and an ISA compatible extension bus.

Operating instructions and test results are displayed on the 8 line by 40 column liquid crystal display (LCD) with back lighting. Test results can also be printed on an external or built-in printer. The printer can use standard calculator-type roll paper. Text entry and menu selections for different tests are performed using a miniature keyboard with full alphanumeric support. Test result data can be saved to 3.5 inch IBM formatted floppy disks on an external or built-in floppy disk drive. Test result data can also be saved to the solid state hard drive.

Figure 9:
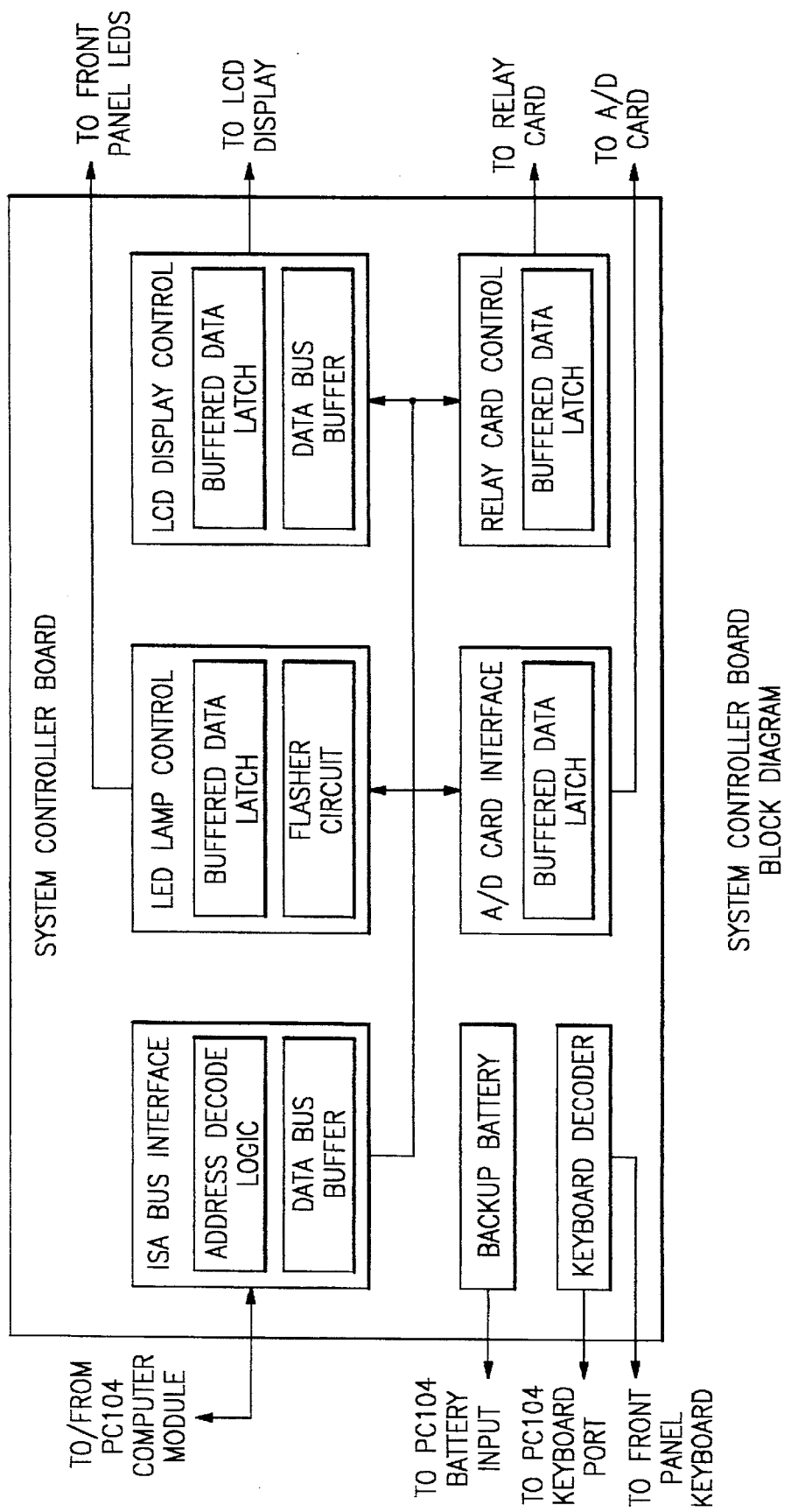
FIG. 9 illustrates a detailed block diagram of an example embodiment of the system controller of FIG. 8.

The system controller functions as an interface between the PC104 computer module and the low voltage testing circuit, the high voltage testing circuit, and the relays. The system controller is electrically connected to the data and address bus of the PC104 computer module. FIG. 9 illustrates a detailed block diagram of the system controller. The system controller includes an LCD display controller, an LED lamp controller, a relay card controller and an analog-to-digital converter circuit interface all interconnected to an ISA bus interface as shown.

The ISA bus interface includes address decode logic and data bus buffering circuitry. The LED lamp controller includes a buffered data latch which is written to as an I/O port, and a flasher circuit connected to a solid state warning light as a high voltage warning lamp. Individual LEDs are turned on or off by writing ones or zeros to the appropriate I/O port. The LCD display controller includes a buffered data latch which is written to as an I/O port, and an 8 bit data bus buffer which allows direct data writes to the LCD display. The data latch is used to control the LCD display control lines by writing ones or zeros to the appropriate I/O port. The characters to be displayed (and their attributes) are written directly to the LCD display via the data bus buffer.

The analog-to-digital converter circuit interface includes a buffered data latch for writing to the analog-to-digital converter circuit of the controller, and a buffered data latch for reading from the analog-to-digital converter circuit. Control data is sent to the analog-to-digital converter circuit, and data read from the analog-to-digital converter circuit in a synchronous serial format. Reads and writes are performed through I/O port reads and writes, with the PC104 computer module handling the timing and formatting of the serial data. The relay card controller includes a buffered data latch which is written to as an I/O port. The data latch outputs are then sent to the relay control circuit as input control signals. Relays are turned on or off by writing ones or zeros to the appropriate I/O port. The system controller can also include a backup battery for the PC104 computer module, and a keyboard encoder which converts keyboard switch closures to the corresponding scan code and sends them to the PC104 computer module keyboard port.

The standard 9-pin RS232 serial port of the PC104 computer module can be connected to a remote printer, or to a computer for transferring test data. Indicator LEDs provide a pass/fail indication for each test based on preselected criteria. The solid-state warning light flashes whenever dangerous voltage is present at the test leads.

Figure 10:
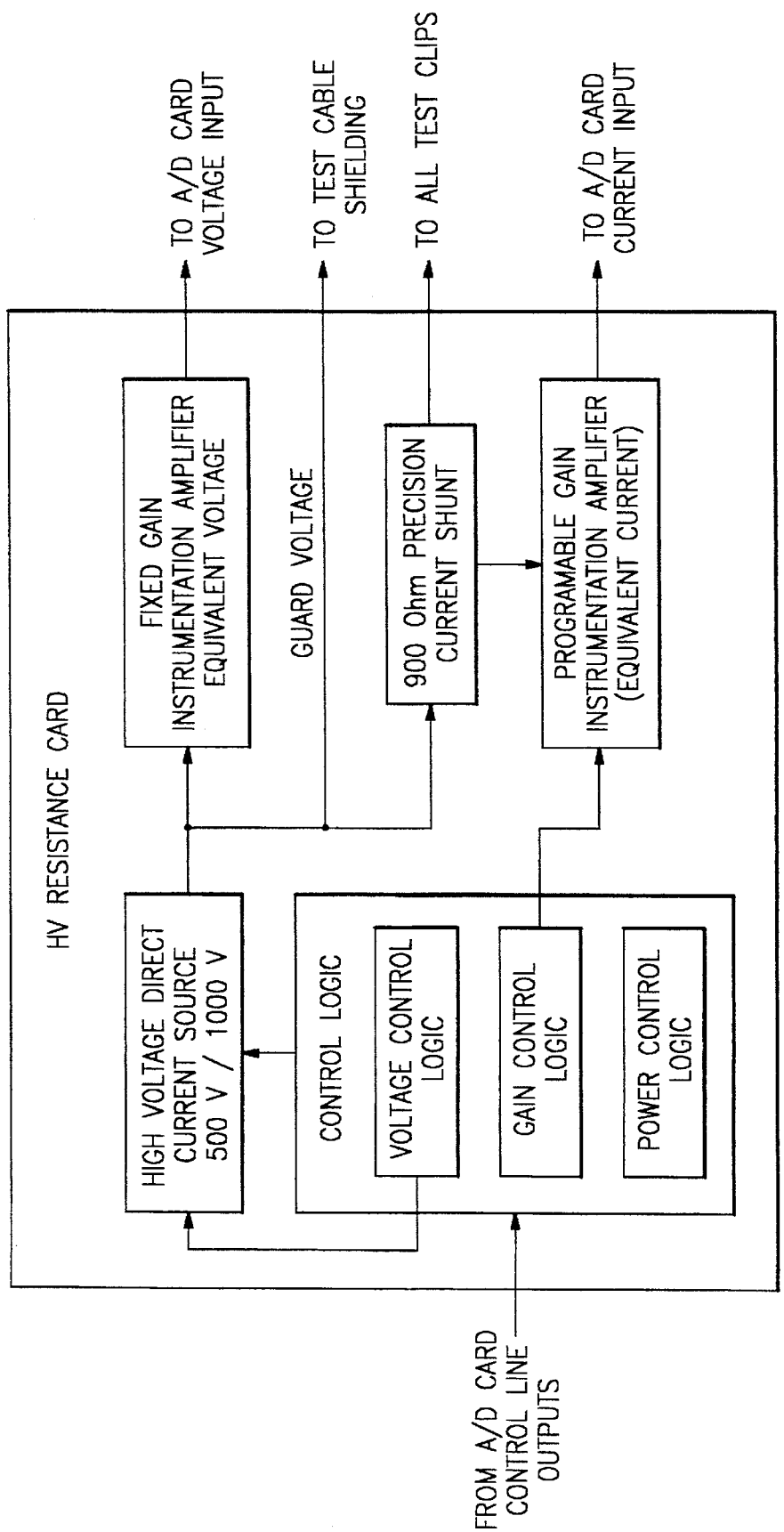
FIG. 10 illustrates a detailed block diagram of an example embodiment of the insulation resistance measurement circuit of the analyzer for interface with the controller of FIG. 8.

FIG. 10 illustrates a detailed block diagram of a preferred embodiment of the insulation resistance measurement circuit of the analyzer for interface with the controller of FIG. 8. The insulation resistance circuit measures the leakage current of a motor insulation when a high voltage is applied. A High voltage direct current source supplies either 500 or 1000 volts to the relays. During insulation resistance testing a high voltage is applied to the motor windings and a small leakage current is produced. The leakage current passes through a 900 ohm precision current shunt, and the voltage developed across the shunt resistor is then fed into a programmable gain instrumentation amplifier. The output of the amplifier (proportional to the leakage current) is then directed to the analog-to-digital converter circuit for conversion to digital data. The test voltage is applied to a voltage divider and then directed to a fixed gain instrumentation amplifier for scaling and buffering. The amplifier output (proportional to the test voltage) is then directed to the analog-to-digital converter circuit for conversion to digital data.

A control logic circuit receives control signals from the analog-to-digital converter circuit. The control logic circuit includes voltage control logic to select the output voltage (0, 500, or 1000), and gain control logic to set the gain of the programmable gain instrumentation amplifier to 1, 10, 100, or 1000 times, and power control logic responsive to control signals from the analog-to-digital converter circuit to turn the insulation measurement circuit on and off.

The insulation resistance measurement circuit is used in coil insulation resistance measurement tests. In operation, the insulation resistance of a motor coil is measured by applying a DC voltage of either 500 or 1000 volts to the motor terminals and measuring the leakage current to the motor frame or to earth ground. The test voltage is applied through the same test clips 58 used for coil resistance and impedance measurements. During this test the low voltage measurement circuits are protected by high voltage isolation relays under computer control. The test voltage and the leakage current are both converted to digital data and the insulation resistance is calculated by the computer. Upon completion of the test, the residual voltage is monitored until it drops to a safe level.

Figure 11:
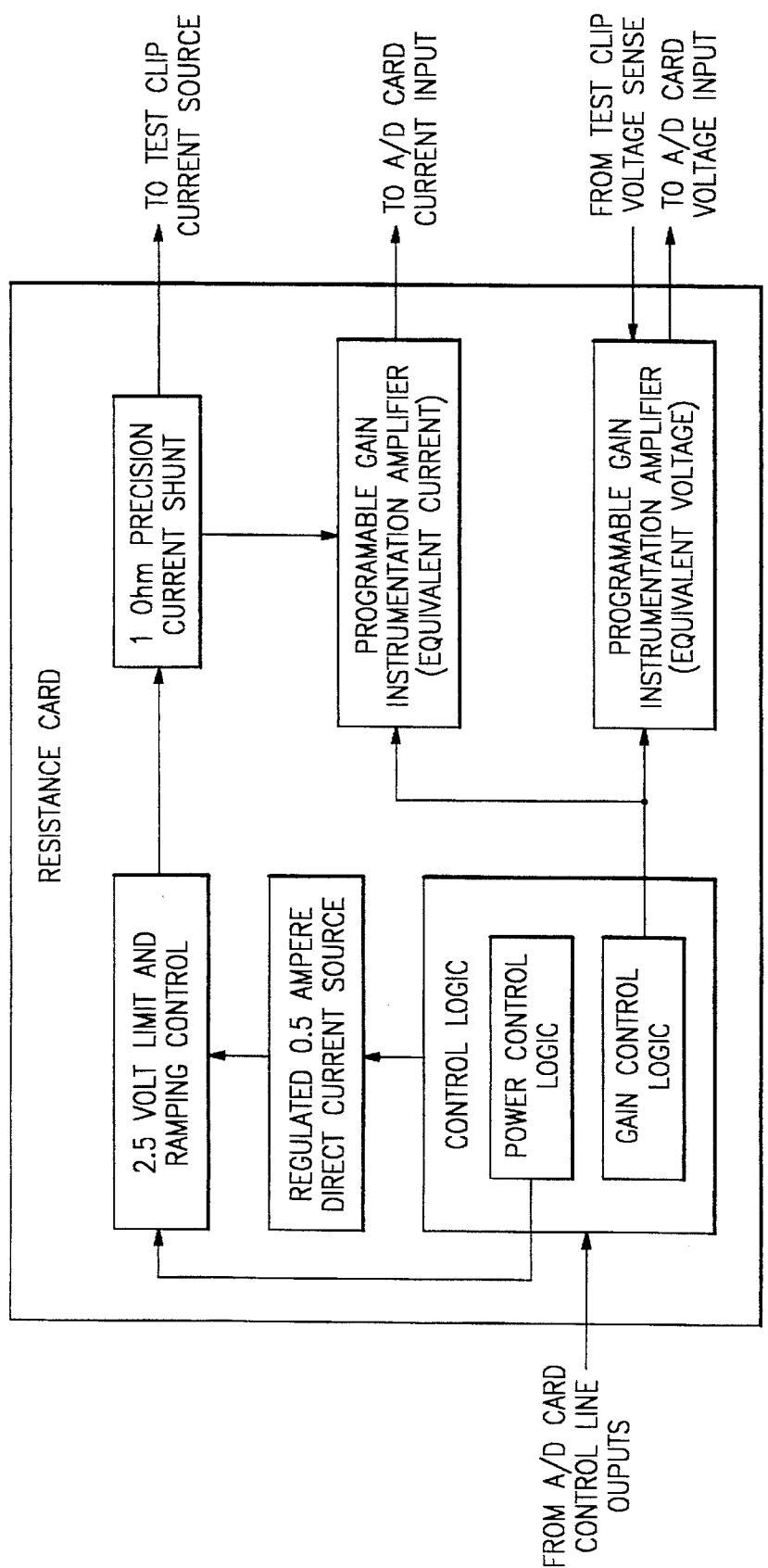
FIG. 11 illustrates a detailed block diagram of an example embodiment of the low voltage resistance measurement circuit of the analyzer for interface with the controller of FIG. 8.

FIG. 11 illustrates a detailed block diagram of a preferred embodiment of the low voltage resistance measurement circuit of the analyzer for interface with the controller of FIG. 8. The resistance measurement circuit supplies a regulated direct current to a coil under test and measures the voltage generated across the coil to calculate the coil resistance. A regulated 0.5 ampere direct current source supplies a maximum of 0.5 amperes at a maximum voltage of 2.5 volts. When measuring resistances below 5 ohms, the current is fixed and the voltage varies. When the test resistance is greater than 5 ohms, the current begins to drop and the voltage becomes fixed. This dual mode regulation allows for a wider dynamic range of resistance measurement.

The actual current is passed to the relays through a 1 ohm precision shunt resistor and the output voltage of the shunt resistor is fed into a programmable gain instrumentation amplifier. The output voltage of the amplifier (proportional to the current) is directed to the analog-to-digital converter circuit for conversion to digital data. The voltage developed across the coil under test is directed from the relays into another programmable gain instrumentation amplifier the output of which is sent to the analog-to-digital converter circuit. The control logic circuit includes power control logic to receive control signals from the analog-to-digital converter circuit to turn the current source on and off. The control logic also includes gain control logic for setting the gain of the amplifiers to 1, 10, 100 or 1000 times.

The resistance measurement circuit is used for coil resistance tests to measure the resistance of an individual motor coil down to a resolution of 0.0001 ohm. In operation, a direct current of 0.5 amps is applied to the coil under test through the current source contact of the test clips 58. The resultant voltage across the motor coil terminals is then measured using the voltage sense contacts of the test clips 58. The analog values of current and voltage are then converted to digital data, and the resistance value is calculated by the PC104 computer module. The switching relay matrix under the control of the PC104 computer module is used to select which coil is being measured.

The low voltage resistance circuit can also include a voltage limiting and ramping circuit to provide protection for the test circuitry. The high reactance of an induction machine can create damaging high voltage spikes when a voltage source is suddenly applied or removed. The ramping function is designed to prevent damage due to spikes by slowly raising the test voltage to the maximum value at turn-on, and slowly lowering the test voltage to zero at turn-off. The ramp period is preferably 2 to 3 seconds. The limiting function prevents the test voltage from exceeding the preferred maximum 2.5 volts.

Figure 12:
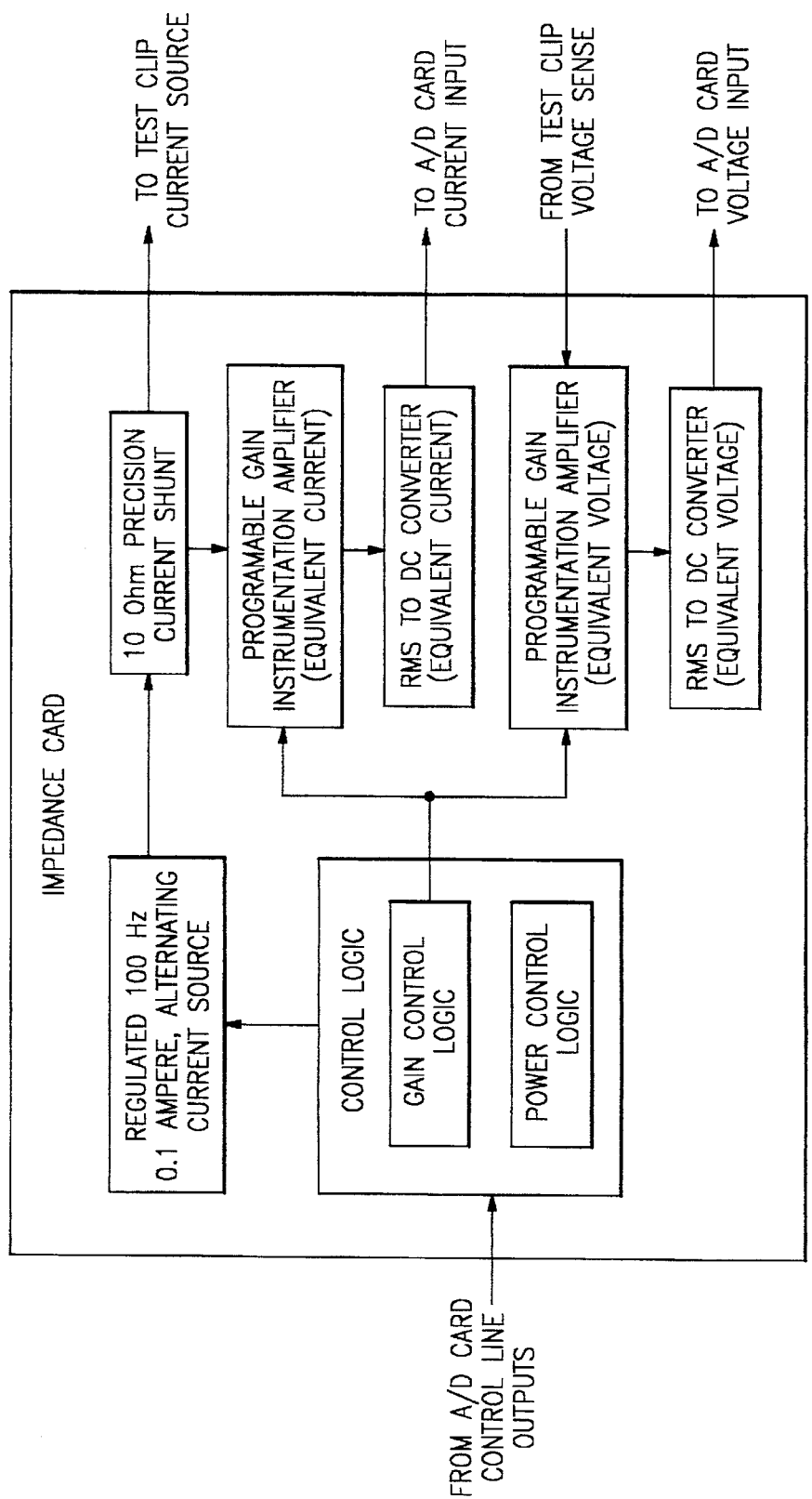
FIG. 12 illustrates a detailed block diagram of an example embodiment of the low voltage impedance measurement circuit of the analyzer for interface with the controller of FIG. 8.

FIG. 12 illustrates a detailed block diagram of a preferred embodiment of the low voltage impedance measurement circuit of the analyzer for interface with the controller of FIG. 8. The impedance measurement circuit supplies a regulated alternating current to the coil under test and measures the voltage generated across the coil to calculate the coil impedance. A Regulated 100 Hz, 0.1 ampere, alternating current source supplies a 0.1 amperes at a maximum voltage of 2.5 volts. The alternating current is directed to the relays through a 10 ohm precision shunt resistor and the output voltage of the shunt resistor is fed into a programmable gain instrumentation amplifier. The output voltage of the amplifier (proportional to the current) is fed into an RMS to DC converter to generate a direct current voltage which is proportional to the RMS value of the current. This voltage is then directed to the analog-to-digital converter circuit for conversion to digital data.

The AC voltage developed across the coil under test is directed from the relays into another RMS to DC converter the output of which is proportional to the RMS value of the AC voltage across the coil. This voltage is then fed into a second programmable gain instrumentation amplifier the output of which is sent to the analog-to-digital converter circuit. The impedance measurement circuit also includes power control logic to receive signals from the analog-to-digital converter circuit to turn the current source on and off. The impedance measurement circuit also includes gain control logic to set the gain of the amplifiers to 1, 10, 100, or 1000 times.

The impedance measurement circuit is used in coil impedance tests to measure the impedance of an individual motor coil down to a resolution of 0.001 ohm. In operation, an alternating current of 100 milliamps and 100 Hz is applied to the coil under test through the current source contact of the test clips 58. The resultant voltage across the motor coil terminals is then measured using the voltage sense contacts of the test clips 58. The measured AC voltage is bandpass filtered to eliminate any noise and then converted to DC by an RMS to DC converter circuit. The analog values of current and voltage are then converted to digital data, and the resistance value is calculated by a microprocessor. The switching relays under the control of the PC104 computer module are used to select which coil is being tested.

Figure 13:
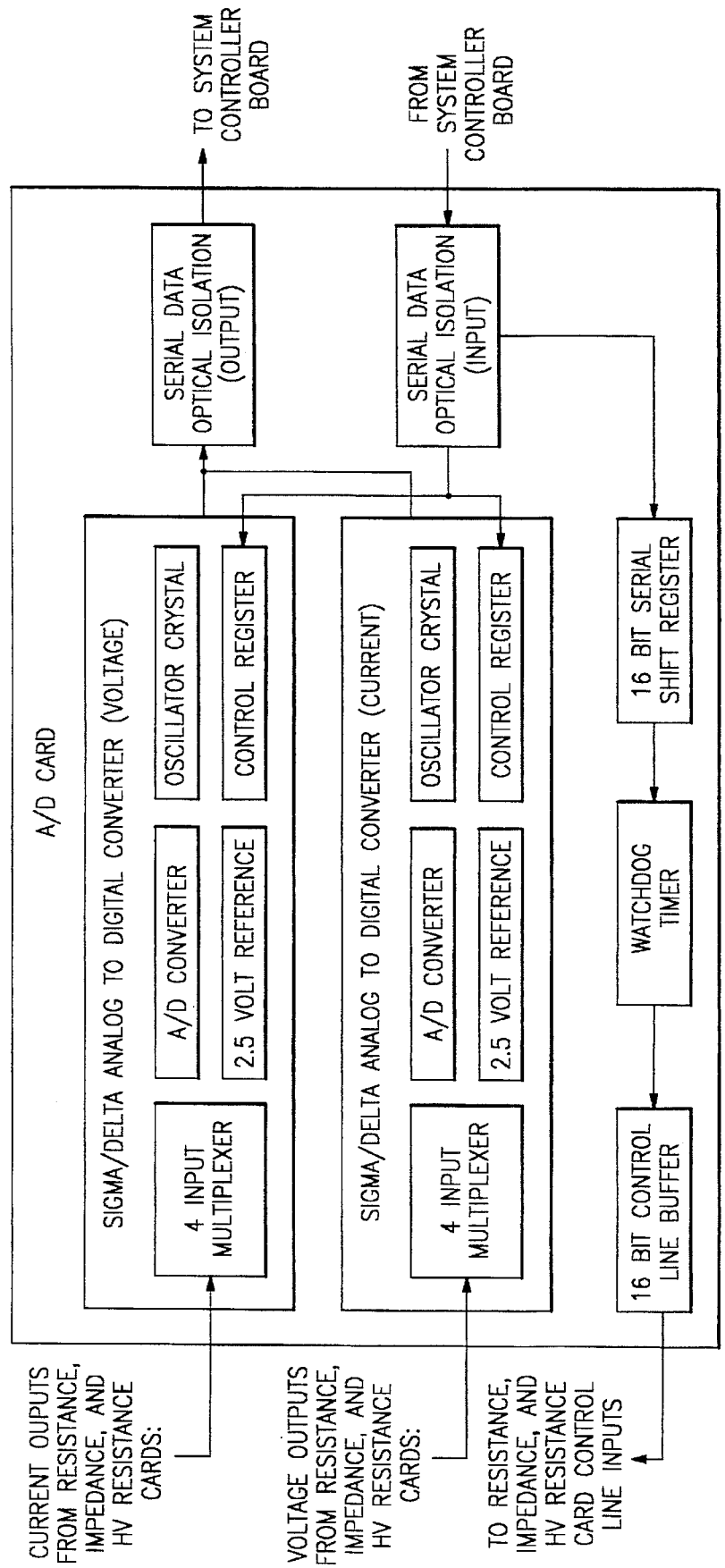
FIG. 13 illustrates a detailed block diagram of an example embodiment of the analog-to-digital converter circuit of the analyzer for interface with the controller of FIG. 8.

FIG. 13 illustrates a detailed block diagram of a preferred embodiment of the analog-to-digital converter circuit of the analyzer for interface with the controller of FIG. 8. In this embodiment, the analog-to-digital converter circuit performs both partial system control and analog to digital data conversion functions. A set of high speed optocouplers provide complete isolation for the serial communication lines which connect to the system controller. A pair of A/D converters allow simultaneous conversion of both current and voltage outputs from the high and low voltage testing circuits.

Each A/D converter has multiplexed inputs to select between the low voltage resistance measurement circuit, the low voltage impedance measurement circuit, or the high voltage insulation resistance measurement circuit. The multiplexer input is selected by sending serial data from the system controller to a data latch which is connected to the multiplexer control lines. Data conversion and self-calibration are initiated in a similar manner, with the data latch connected to the convert and calibrate control lines of the A/D converter. Data is read from the A/D converters in serial format directly from the A/D converter data lines. The data is shifted out one bit at a time and read by the system controller under control of the PC104 computer module.

The analog-to-digital converter circuit also includes buffered outputs for controlling the selection of other circuits, the gain factor of the programmable gain instrumentation amplifiers on other circuits, and the output voltage of the high voltage power supply. Control data for these lines is received from the system controller and stored in a data latch. The output enable line of the data latch is controlled by a watchdog timer circuit which monitors the optocouplers for any serial data input. If no serial data has been received for more than 1 second, the watchdog times out and disables the output of the data latch. This puts the system in a safe state in case of computer malfunction: no measurement circuits selected, high voltage output set to zero, and the gain is set to 1. Line drivers are used to buffer the control lines which connect to the other circuits via a backplane.

FIG. 14 illustrates a detailed block diagram of a preferred embodiment of the relay control circuit of the analyzer for interface with the controller of FIG. 8. In this embodiment, the relay control circuit includes the relay switches. The relay control circuit includes optical isolation, a set of high voltage isolation relays, a set of low voltage relays, and circuit protection. The optical isolation provides complete electrical isolation for the relay control lines coming from the system controller. The high voltage isolation relays select which test clips are connected to the resistance measurement circuit or the impedance measurement circuit during low voltage tests (coil resistance or impedance). During high voltage tests (insulation resistance or polarization index) the high voltage isolation relays connect the high voltage direct current source of the insulation resistance measurement circuit to the test leads, and isolate the resistance measurement circuit and the impedance measurement circuit from any high voltage by opening the switching relays.

When the high voltage testing is complete, a discharge relay drains any remaining high voltage. The low voltage relays select between the resistance measurement circuit and the impedance measurement circuit for measuring coil resistance or impedance. A shorting relay connects the current source and voltage sense lines together for self-diagnostic purposes. During high voltage testing, a grounding relay connects the system ground to chassis ground. Circuit protection is provided by an array of varistors to prevent overvoltage conditions, and a set of 2 ampere fuses to prevent overcurrent conditions.

The analyzer of the present invention can be used in assessing the condition of single phase and three phase alternating current motors. Testing may be performed automatically, or individual tests may be selected from a menu and run under manual control. All tests may be performed without the need for the operator to make any changes to the test lead connections. Gathered data may be reviewed on the LCD display, saved to disk, or printed on the internal printer.

The steps taken by the PC104 computer module in the operation of the analyzer can be programmed in a conventional programming language such as C. Appendix A lists an example embodiment of such a program for the PC104 computer.

The present invention has been described in considerable detail with reference to certain preferred versions thereof; however, other versions are possible. Therefore, the spirit and scope of the appended claims should not be limited to the description of the preferred versions contained herein.

What is claimed is:

1. An analyzer for performing high and low voltage tests on an electric induction machine having electric power input terminals, the analyzer comprising:
    (a) a high voltage testing circuit for performing high voltage tests on the induction machine;
    (b) a low voltage testing circuit for performing low voltage tests on the induction machine;
    (c) electrical terminals for electrical connection with the power input terminals of the induction machine;
    (d) a plurality of switches electrically connecting the high voltage testing circuit and the low voltage testing circuit to the terminals, each switch having one or more control input terminals for receiving control signals for closing and opening the switch; and
    (e) a controller having a first set of output terminals electrically connected to the control input terminals of the switches, the controller providing control signals to the switches to selectively open one or more of the switches and to selectively close one or more of the switches to:
        (i) provide electrical conduction paths between the high voltage testing circuit and the induction machine through the closed switches, while electrically isolating the low voltage testing circuit from the high voltage testing circuit through the open switches; and
        (ii) provide electrical conduction paths between the low voltage testing circuit and the conduction machine through the closed switches, while electrically isolating the high voltage testing circuit from the low voltage testing circuit through the open switches.

2. The analyzer of claim 1 wherein the switches comprise: (i) one or more high voltage relay switches for providing electrical conduction paths between the high voltage testing circuit and the conduction machine, and (ii) one or more low voltage relay switches for providing electrical conduction paths between the low voltage testing circuit and the conduction machine.

3. The analyzer of claim 1 wherein the high voltage testing circuit generates a test voltage of at least about 500 volts, and the low voltage testing circuit generates a test voltage of at most about 2.5 volts.

4. The analyzer of claim 1 wherein:
    (a) the high voltage testing circuit comprises an insulation resistance measurement circuit; and
    (b) the low voltage testing circuit comprises a resistance measurement circuit and an impedance measurement circuit.

5. The analyzer of claim 4 wherein:
    (a) the insulation resistance measurement circuit supplies a high voltage direct current to the induction machine and measures a resulting leakage current of the induction machine;
    (b) the resistance measurement circuit supplies a direct current to the induction machine and measures a resulting voltage to determine the resistance of the induction machine; and
    (c) the impedance measurement circuit supplies an alternating current to the induction machine and measures a resulting voltage to determine the impedance of the induction machine.

6. The analyzer of claim 1 wherein:
    (a) the low voltage testing circuit includes a switch responsive to control input signals for initiating low voltage tests;
    (b) the high voltage testing circuit includes a switch responsive to control input signals for initiating high voltage tests; and
    (c) the controller generates:
        (i) an input control signal for the low voltage testing circuit to perform low voltage testing after the controller has provided electrical conduction paths between the low voltage testing circuit and the conduction machine; and
        (ii) an input control signal for the high voltage testing circuit to perform high voltage testing after the controller has provided electrical conduction paths between the high voltage testing circuit and the induction machine.

7. The analyzer of claim 6 wherein the controller sequentially signals the low and high voltage testing circuits to perform low and high voltage tests, respectively.

8. The analyzer of claim 1 wherein:
    (a) the high voltage testing circuit generates test-result output signals representative of results of high voltage testing of the induction machine;
    (b) the low voltage testing circuit generates test-result output signals representative of results of low voltage testing of the induction machine; and (c) the controller includes a processor responsive to the high voltage testing circuit and responsive to the low voltage testing circuit for receiving high and low voltage test-result output signals from said testing circuits, and for processing the signals to generate a report indicative of the status of the induction machine.

9. The analyzer of claim 1 further comprising a housing, wherein the high and the low voltage testing circuits, the switches and the controller are disposed in the housing.

10. An analyzer for performing high and low voltage tests on an electric induction machine having electric power input terminals, the analyzer comprising:

(a) a high voltage testing circuit for performing high voltage tests on the induction machine, the high voltage testing circuit including an insulation resistance measurement circuit;

(b) a low voltage testing circuit for performing low voltage tests on the induction machine, the low voltage testing circuit including a resistance measurement circuit and an impedance measurement circuit;

(c) electrical terminals for electrical connection with the power input terminals of the induction machine;

(d) a plurality of switches electrically connecting the high voltage testing circuit and the low voltage testing circuit to the terminals, each switch having one or more control input terminals for receiving control signals for closing and opening the switch, wherein the switches comprise one or more high voltage relay switches for providing electrical conduction paths between the high voltage testing circuit and the conduction machine, and one or more low voltage relay switches for providing electrical conduction paths between the low voltage testing circuit and the conduction machine; and (e) a controller having a first set of output terminals electrically connected to the control input terminals of the switches, the controller providing control signals to the switches to selectively open one or more of the switches and to selectively close one or more of the switches to:

(i) provide electrical conduction paths between the high voltage testing circuit and the induction machine through the closed switches, while electrically isolating the low voltage testing circuit from the high voltage testing circuit through the open switches; and (ii) provide electrical conduction paths between the low voltage testing circuit and the conduction machine through the closed switches, while electrically isolating the high voltage testing circuit from the low voltage testing circuit through the open switches.

11. The analyzer of claim 10 wherein:

(a) the insulation resistance measurement circuit supplies a high voltage direct current to the induction machine and measures a resulting leakage current of the induction machine;

(b) the resistance measurement circuit supplies a direct current to the induction machine and measures a resulting voltage to determine the resistance of the induction machine; and (c) the impedance measurement circuit supplies an alternating current to the induction machine and measures a resulting voltage to determine the impedance of the induction machine.

12. The analyzer of claim 11 wherein:

(a) the low voltage testing circuit includes a switch responsive to control input signals for initiating low voltage tests;

(b) the high voltage testing circuit includes a switch responsive to control input signals for initiating high voltage tests; and (c) the controller generates:

(i) an input control signal for the low voltage testing circuit to perform low voltage testing after the controller has provided electrical conduction paths between the low voltage testing circuit and the conduction machine; and (ii) an input control signal for the high voltage testing circuit to perform high voltage testing after the controller has provided electrical conduction paths between the high voltage testing circuit and the induction machine.

13. The analyzer of claim 12 wherein the controller sequentially signals the low and high voltage testing circuits to perform low and high voltage tests, respectively.

14. The analyzer of claim 13 wherein:

(a) the high voltage testing circuit generates test-result output signals representative of results of high voltage testing of the induction machine;

(b) the low voltage testing circuit generates test-result output signals representative of results of low voltage testing of the induction machine; and (c) the controller includes a processor responsive to the high voltage testing circuit and responsive to the low voltage testing circuit for receiving high and low voltage test-result output signals from said testing circuits, and for processing the signals to generate a report indicative of the status of the induction machine.

15. The analyzer of claim 14 further comprising a housing, wherein the high and the low voltage testing circuits, the switches and the controller are disposed in the housing.

16. The analyzer of claim 15 wherein the high voltage testing circuit generates a test voltage of at least about 500 volts, and the low voltage testing circuit generates a test voltage of at most about 2.5 volts.

17. A method of performing high and low voltage tests on an electric induction machine having electric power input terminals, the method comprising the steps of:

(a) providing an analyzer comprising:

(i) a high voltage testing circuit for performing high voltage tests on the induction machine;

(ii) a low voltage testing circuit for performing low voltage tests on the induction machine;

(iii) electrical terminals for electrical connection with the power input terminals of the induction machine;

(iv) a plurality of switches electrically connecting the high voltage testing circuit and the low voltage testing circuit to the terminals, each switch having one or more control input terminals for receiving control signals for closing and opening the switch; and (v) a controller having a first set of output terminals electrically connected to the control input terminals of the switches, the controller providing control signals to the switches to selectively open one or more of the switches and to selectively close one or more of the switches to:

(1) provide electrical conduction paths between the high voltage testing circuit and the induction machine through the closed switches, while electrically isolating the low voltage testing circuit from the high voltage testing circuit through the open switches; and (2) provide electrical conduction paths between the low voltage testing circuit and the conduction machine through the closed switches, while electrically isolating the high voltage testing circuit from the low voltage testing circuit through the open switches;

(b) electrically connecting the terminals of the analyzer to the power input terminals of the induction machine;

(c) performing high voltage testing on the induction machine utilizing the analyzer; and (d) performing low voltage testing on the induction machine utilizing the analyzer.

18. The method of claim 17 wherein the high voltage testing circuit generates a test voltage of at least about 500 volts, and the low voltage testing circuit generates a test voltage of at most about 2.5 volts.

19. The method of claim 18 wherein:

(a) the step of performing high voltage testing includes performing an insulation resistance measurement; and (b) the step of performing low voltage testing includes performing a resistance measurement and an impedance measurement.

* * * * *